United States Patent [19]

Sonobe et al.

[11] 4,068,135
[45] Jan. 10, 1978

[54] SIGNAL ISOLATING AND SAMPLING CIRCUIT

[75] Inventors: Tadashi Sonobe; Seiji Onoki, both of Kanagawa, Japan

[73] Assignee: Honeywell Inc., Minneapolis, Minn.

[21] Appl. No.: 742,513

[22] Filed: Nov. 16, 1976

[30] Foreign Application Priority Data

Dec. 30, 1975   Japan .................................. 50-158341

[51] Int. Cl.$^2$ ............................................ H03K 17/78
[52] U.S. Cl. ..................................... 307/352; 307/251; 307/282; 307/311; 328/151
[58] Field of Search ............... 307/251, 282, 311, 304, 307/352; 328/151

[56] References Cited

U.S. PATENT DOCUMENTS

| | | | |
|---|---|---|---|
| 3,467,836 | 9/1969 | Thomas | 307/311 X |
| 3,789,244 | 1/1974 | Provanzand | 307/251 |
| 3,818,235 | 6/1974 | Johnson et al. | 307/311 X |
| 3,867,580 | 2/1975 | Russell | 307/311 X |
| 3,917,963 | 11/1975 | Wadlington | 307/352 |
| 3,940,634 | 2/1976 | Grogan | 307/311 X |

Primary Examiner—John S. Heyman
Attorney, Agent, or Firm—Laurence J. Marhoefer; Lockwood D. Burton; Mitchell J. Halista

[57] ABSTRACT

A signal isolating and sampling circuit using a transformer to isolate a signal input circuit from a signal output circuit. Signal sampling switches are used in the input and output circuits to sample an input signal applied to the input circuit. A photocoupler is provided for coupling a switch selecting signal to the sampling switch in the input circuit while an energizing signal for driving the sampling switch in the input circuit is supplied through the transformer from an energizing signal source connected to the signal output circuit. The energizing signal is rectified in the signal input circuit and used to drive the signal input circuit sampling switch under control of the switch selecting signal.

5 Claims, 8 Drawing Figures

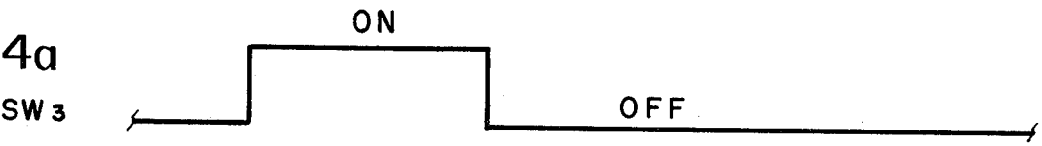
FIG.4a SW3
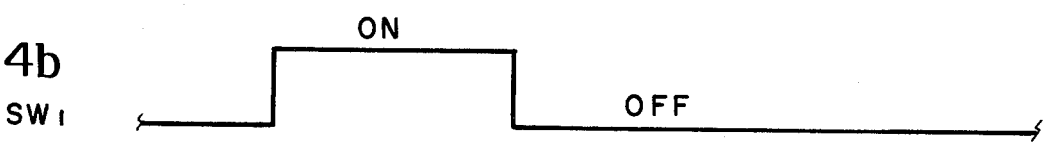
FIG.4b SW1
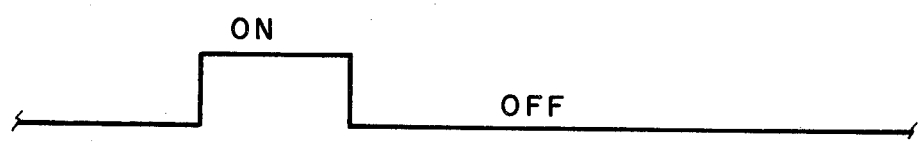
FIG.4c SW2
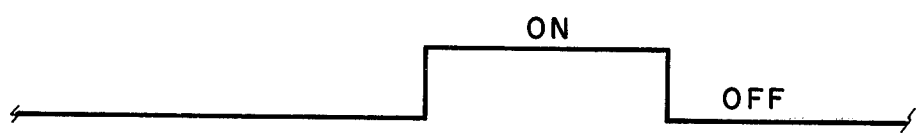
FIG.4d SW4
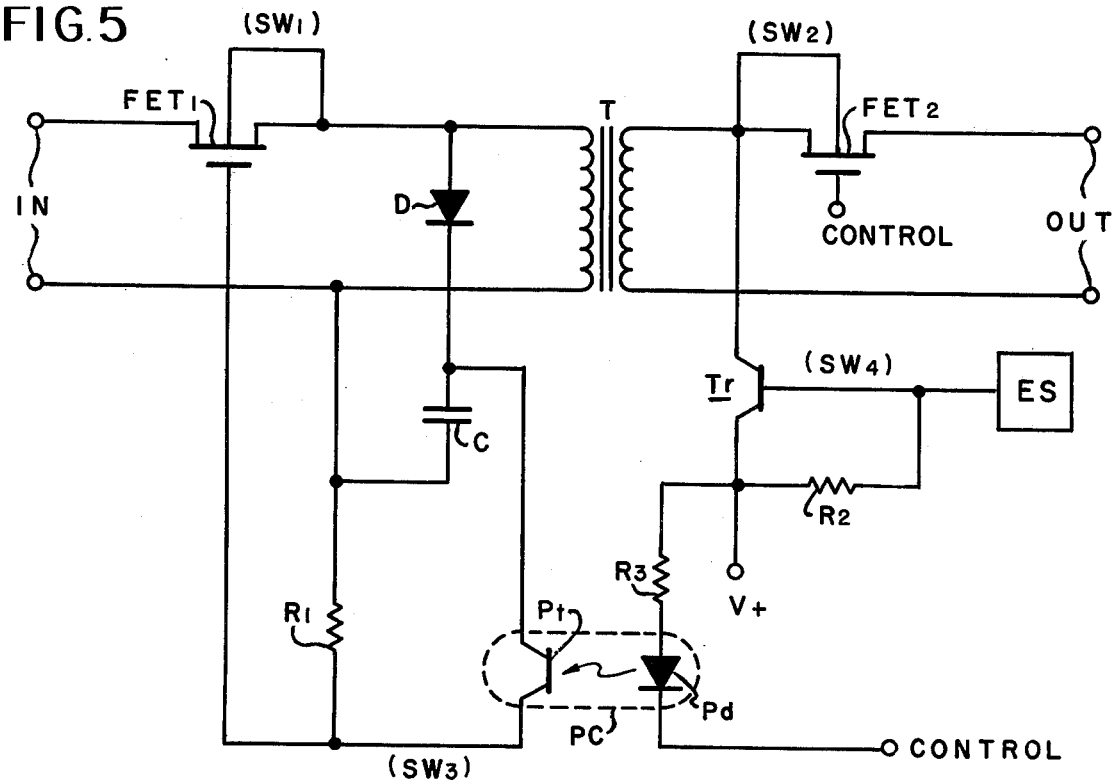
FIG.5

SIGNAL ISOLATING AND SAMPLING CIRCUIT

BACKGROUND OF THE INVENTION

1. Field Of The Invention

The present invention relates to signal sampling circuits. More specifically, the present invention is directed to a signal sampling circuit having signal isolating means for conductively isolating a signal input circuit from a signal output circuit.

2. Description Of The Prior Art

A prior art sampling circuit with a signal isolating capability used a first transformer to couple a signal input circuit to a signal output circuit. Switches were provided on the primary and secondary sides of the transformer and were synchronously operated to sample an input signal. A second transformer is used to couple a switch energizing signal to the sampling switches on the primary and secondary sides of the first transformer. Such a prior art circuit requires shielding between the transformers and is uneconomical because of the added cost of a second transformer. Another prior art circuit used a photocoupler to directly transfer an input signal from an input circuit to an output circuit. This prior art circuit required a conversion of the input signal to a pulse-width modulated signal before transmission by the photocoupler, and a demodulation after transmission by the photocoupler. Thus, this prior art circuit is more complicated than the aforesaid prior art circuit and even less economical as a result of the expensive converter circuits and their isolated power supplies.

SUMMARY OF THE INVENTION

An object of the present invention is to provide an improved signal isolating and sampling circuit for overcoming the aforesaid prior art problems.

In accomplishing this and other objects, there has been provided, in accordance with the present invention, a signal isolating and sampling circuit having a transformer for coupling a signal input circuit to a signal output circuit while providing conductive isolation therebetween. A photocoupler is arranged to supply a switch selecting signal to a sampling switch provided on the signal input circuit side of the transformer. A switch energizing pulse for driving the sampling switch is supplied through the transformer from the secondary side of the transformer between signal sampling operations.

BRIEF DESCRIPTION OF THE DRAWINGS

A better understanding of the present invention may be had when the following description is read in connection with the accompanying drawings, in which:

FIG. 4(a) - 4(d) are timing diagrams illustrating the operation of the circuit shown in FIG. 3, and FIG. 5 is a detailed schematic illustration of a signal isolating and sampling circuit also embodying the present invention.

DETAILED DESCRIPTION

Figure 1:
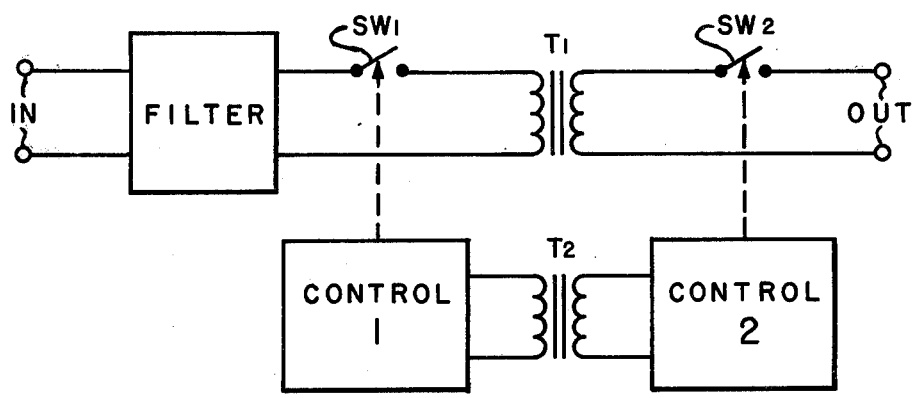
FIG. 1 is a block diagram of a prior art transformer coupled signal isolating and sampling circuit.

A transformer coupled prior art isolator and sampling circuit is shown in FIG. 1 in which "IN" designates an input terminal adapted to receive an input signal and "OUT" an output terminal. FILER designates a signal filter comprising an RC network $T_1$ is a signal transmission transformer, and $SW_1$ and $SW_2$ are first and second switches provided on the primary and secondary sides respectively on the signal transmission transformer $T_1$. Switches $SW_1$ and $SW_2$ are arranged to operate synchronously. CONTROL 1 is a first control circuit for controlling the first switch $SW_1$, and CONTROL 2 is a second control circuit for controlling the second switch $SW_2$. A control transformer $T_2$ is interposed between the first and second control circuits CONTROL 1 and CONTROL 2 for synchronizing the operation of the first switch $SW_1$ with the second switch $SW_2$. With the isolator of this construction, the input signal applied to input terminal "IN" enters into the primary side of the signal transmission transformer $T_1$ via the first switch $SW_1$ and the signal induced on the secondary side of the transformer $T_1$ is sent to the output terminal "OUT" via the second switch $SW_2$.

With such a prior art isolator and sampling circuit, however, there is an electromagnetic coupling between the input signal transmission transformer $T_1$ and switch operating transformer $T_2$ for controlling the first switches $SW_1$ and $SW_2$, and it is difficult in practice to effectively shield both transformers to neutralize this inter-transformer coupling. Moreover, such a signal isolator and coupling circuit is not economical because it requires a second transformer $T_2$ for controlling the switches $SW_1$ and $SW_2$.

Figure 2:
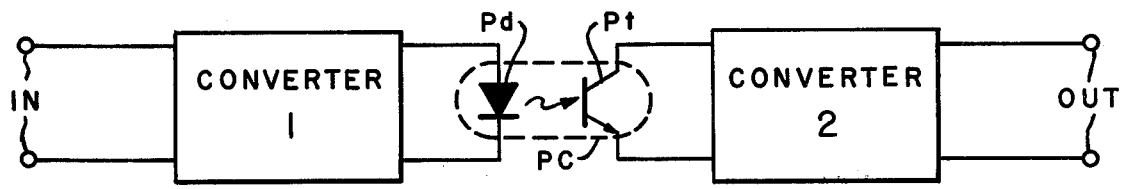
FIG. 2 is a block diagram of a prior art photocoupler signal isolating and sampling circuit.

A prior art circuit using a photocoupler as shown in FIG. 2 has been proposed to obviate the transformer problems described above. In FIG. 2, "IN" represents an input terminal, "OUT" an output terminal, Pd is a luminous, i.e., light emitting, element and Pt a light receiving element in a photocoupler PC. CONVERTER 1 represents an analogue-pulse width converter and CONVERTER 2 a pulse width-analogue converter. With this prior art isolator circuit, an analogue signal impressed upon input terminal "IN" is converted into a pulse width by the analogue-pulse width converter CONVERTER and the output thereof is applied to the pulse width analogue converter CONVERTER 2 through the photocoupler PC to be converted into an analogue signal. Thus, an analogue signal corresponding to the input signal appears on the output termnal "OUT."

The isolator shown in FIG. 2, however, is even more complicated than that shown in FIG. 1 and requires relatively expensive converters for converting an analogue signal into a pulse width and vice versa. Moreover it is necessary to use an isolated (or floating) power source for the converters thus rendering the actual circuit even more complicated and uneconomical.

Figure 3:
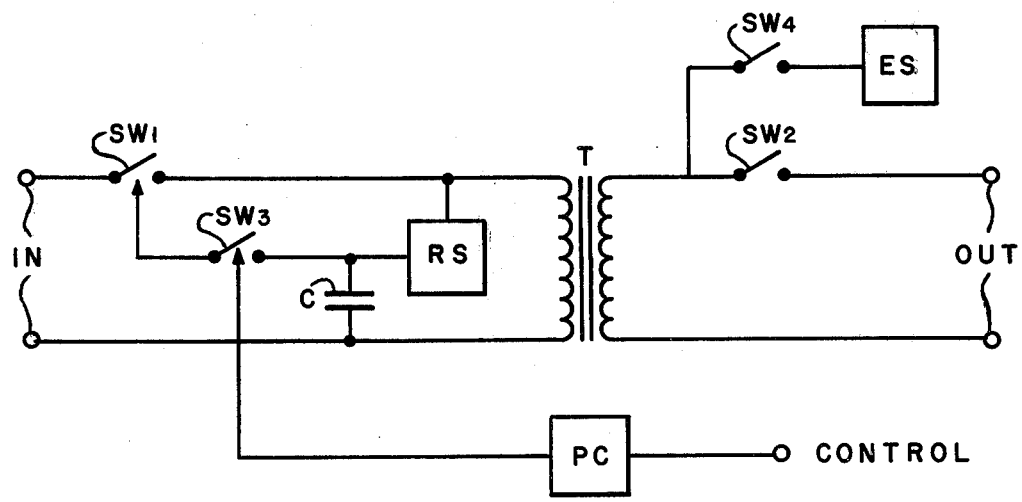
FIG. 3 is a block diagram of a signal isolating and sampling circuit embodying the present invention.

FIG. 3 is a block diagram showing the basic construction of one embodiment of the signal isolating and sampling circuit of this invention in which "IN" represents an input terminal connected to receive an analogue signal, "OUT" is an output terminal, "T" is a transformer for transmitting the input signal and for supplying energy to energize a signal sampling switch on the primary side, and $SW_1$ and $SW_2$ are switches provided on the primary and secondary sides respectively of the transformer "T." Input switch $SW_1$ is a sampling switch for sampling the input signal to send it to the output "OUT" through the transformer "T," and output switch $SW_2$ is a switch for sampling the input signal sent from the sampling switch $SW_1$. These switches are arranged to operate synchronously. Output sampling switch $SW_2$ not only operates to sample the input signal but also prevents a switch energizing signal supplied through a supply switch $SW_4$, described later, from appearing on the output terminal "OUT." Control switch $SW_3$ is a switch for controlling the ON-OFF operation of the sampling switch $SW_1$ in response to the output of a photocoupler PC to be described later. The supply $SW_4$ switch is a supply switch provided on the secondary side of transformer T and is operated to store energy for operating switch $SW_1$ in a capacitor C via transformer T. Source ES represents a power source circuit provided on the secondary side of transformer T for supplying a switch energizing pulse via switch $SW_4$. A rectifying network RS is a rectifying and smoothing circuit that rectifies and flattens the energizing pulse induced on the primary side of transformer T from the source ES. A photocoupler PC supplying a control signal for driving the sampling switch $SW_1$ on the primary side of transformer T is controlled by an external signal applied to a control signal terminal CONTROL. When the output signal from the photocoupler PC closes the supply switch $SW_3$, sampling switch $SW_1$ on the primary side of the transformer T is driven by the output of the rectifying and smoothing circuit RS stored in capacitor C to transmit the input signal to the primary side of transformer T. Since output switch $SW_2$ closes with switch $SW_1$, the input signal is coupled through the transformer T and is applied to the output terminals "OUT."

FIG. 4 shows a time chart to explain the operation of FIG. 3 by showing the operating sequences of respective switches in FIG. 3.

In response to the external control signal CONTROL, the photocoupler PC operates to turn "ON," i.e., close, switch $SW_3$ by its output as shown in FIG. 4a. The closing of switch $SW_3$ enables the charge stored in the capacitor C to be sent to the input sampling switch $SW_1$ to turn it "ON" as shown in FIG. 4b. As the input sampling switch $SW_1$ turns "ON," the input signal applied to the input terminal "IN" appears on the secondary side of transformer T, and then appears on the output terminals "OUT" when output sampling switch $SW_2$ is turned "ON" as shown by FIG. 4c. At this time, supply switch $SW_4$ is in its "OFF," i.e., open, state. After the input signal has been transmitted to the output terminals "OUT" and after the switches $SW_1$, $SW_2$ and $SW_3$ have been turned "OFF," the supply switch $SW_4$ is turned "ON" as shown in FIG. 4d to supply a pulse from pulse source ES via switch $SW_4$ the transformer T and the rectifying network RS to recharge the capacitor C. Thereafter, the above cycle of operation is repeated.

Fig. 5 is a detailed schematic diagram showing a specific construction of one embodiment of the signal isolator and sampler of this invention. In FIG. 5, elements corresponding to those shown in FIG. 3 are designated by the same reference symbols. A diode D comprising the rectifying and smoothing circuits RS and functions to prevent the charge stored on the capacitor C from flowing back to the input terminals "IN" when the sampling switch $SW_1$ is closed. A luminous element Pd and a light receiving element Pt constitute a photocoupler PC for driving the sampling switch $SW_1$ on the primary side of transformer T. A first field effect transistor FET 1 comprises the sampling switch $SW_1$. A second field effect transistor FET 2 comprises the sampling switch $SW_2$. A resistor R1 together with the light receiving element Pt of the photocoupler PC constitutes switch $SW_3$ that controls the "ON" and "OFF" operation of the sampling switch $SW_1$. One end of the receiving element of the light receiving element Pt is connected to the junction between the diode D and one side of the capacitor C whereas the other end thereof is connected to one end of the resistor $R_1$ and to the first gate electrode of the first field effect transistor FET 1 comprising the sampling switch $SW_1$. The other end of resistor $R_1$ is connected to the other side capacitor C, to one terminal of the primary of transformer T and one of the input terminals "IN." A PNP type transistor Tr and a resistor R2 constitute source switch $SW_4$. The collector electrode of transistor Tr is connected to the junction between the secondary of transformer T, the drain electrode and the second gate electrode of the field effect transistor $FET_2$ comprising the sampling switch $SW_2$. The emitter electrode of transistor Tr is connected to the base electrode of transistor Tr through resistor $R_2$ and to the anode electrode of the luminous element Pd of the photocoupler PC via resistor $R_3$. The cathode electrode of the luminous element Pd is connected to terminal CONTROL to which is applied an external control signal.

In the isolator and sampler circuit of the present invention constructed as above described, the switch $SW_3$ circuit is turned "ON" by the external control signal applied through the photocoupler PC to control the ON-OFF timing of the sampling switch $SW_1$ provided on the primary side of transformer T. Specifically, the charge stored in capacitor C is applied to the first gate electrode of the first field effect transistor FET 1 comprising the sampling switch $SW_1$ thereby rendering conductive the path between the drain and source electrodes of the first field effect transistor $FET_1$. When the first field effect transistor $FET_1$ conducts, the sampled input signal will appear on the secondary side of the transformer T so that the input signal will be sent to the output terminals "OUT" when the second field effect transistor $FET_2$ comprising the sampling switch $SW_2$ is turned "ON." A control signal to the gate electrode of the second field effect transistor $FET_2$ can either be applied in synchronism with the control signal applied to the control input terminal CONTROL or delayed with respect thereto. The only criteria to be observed is that the timing of the switch circuits shown in FIG. 4 should also be followed in FIG. 5.

After transferring, i.e., sampling, of the input signal is completed, i.e., switches $SW_1$, $SW_2$ and $SW_3$ are open, the transistor Tr comprising the source switch $SW_4$ is turned "ON" so as to supply a supply pulse through transformer T. The supply pulse induced on the primary side of transformer T is rectified by the diode D and smoothed as shown by arrows to recharge capacitor C. Thereafter the above sampling cycle is repeated.

As can be clearly noted from the foregoing description, the primary side sampling switch $SW_1$ of the isolator and sampler circuit of this invention is included in an input line while the transformer T is connected to perform transfer of the supply pulse and the transfer of the input signal at different times so that the function of the isolator and sampler circuit can be provided by a single transformer thereby eliminating electromagnetic interference between a plurality of transformers. Moreover the photoconductor circuit is used without expensive converter circuits. Since the construction is extremely simple, it is possible to fabricate the isolator and sampler circuit of the present invention as a compact unit and to decrease the cost.

Accordingly, it may be seen that there has been provided, in accordance with the present invention, an improved signal isolator and sampling circuit having a relatively simple and inexpensive construction.

The embodiments of the invention in which an exclusive property or privilege is claimed are defined as follows:

1. A signal isolating and sampling circuit comprising
an input terminal
an output terminal,
a transformer means having primary and secondary sides,
an input circuit sampling switch means connected between said primary of said transformer means and said input terminal,
an output circuit sampling switch means connected between said secondary of said transformer means and said output terminal,
a supply source switch means,
a pulse supply means for supplying a switch energizing pulse to the secondary side of said transformer means through said supply source switch,
a rectifying circuit means connected to the primary side of said transformer means for rectifying and storing said energizing pulse induced on said primary side of said transformer means,
a photocoupler circuit means having an input and having an output connecting said input circuit sampling switch means to said rectifying circuit means and
control means for connecting said input of said photocoupler means to a source of a switch selecting control signal for periodically driving said photocoupler circuit means to apply the stored energizing pulse to said input circuit sampling switch means whereby said input circuit sampling switch means is driven by the stored energizing pulse from said rectifying circuit means to connect said input terminal to said primary side of said transformer means and to apply a switch control signal to said supply source switch means to operate said supply source switch means to connect said pulse supply means to said secondary side of said transformer means between the driving of said photocoupler circuit by said switch selecting control signal, 2. A signal isolating and sampling circuit as set forth in claim 1 wherein output circuit sampling switch means includes means for connection to a source of a switch energizing signal to operate said output circuit sampling means to connect said output terminal to said secondary side of said transformer means.

3. A signal isolating and sampling switch circuit as set forth in claim 2 wherein said input and output circuit sampling switch means are operated concurrently.

4. A signal isolating and sampling circuit as set forth in claim 1 wherein said rectifying means includes a pulse rectifying diode means and a storage capacitor means connected in series with said diode means for storing the rectified energizing pulse and circuit means for connecting said series combination of said diode means and said capacitor means across said primary side of said transformer means.

5. A signal isolating and sampling circuit as set forth in claim 4 wherein said photocoupler circuit means include a photo-emitting means connected to said control means to be energized thereby, a photo-receiving means having one end thereof connected to one side of said storage capacitor means, a resistance means connecting the other end of said photo-receiving means to the other end of said capacitor means and circuit means for applying a signal developed across said resistance means as a switch energizing signal to said input circuit sampling switch means.

* * * * *